(12) United States Patent
Boe

(10) Patent No.: US 6,362,978 B1
(45) Date of Patent: Mar. 26, 2002

(54) METHOD AND APPARATUS FOR BIASING A CIRCUIT BOARD INTO ENGAGEMENT WITH A COMPUTER CHASSIS

(75) Inventor: Craig L. Boe, Nampa, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/472,728

(22) Filed: Dec. 27, 1999

(51) Int. Cl.[7] .............................. H05K 7/00; H05K 7/12; H05K 7/14
(52) U.S. Cl. .................... 361/825; 361/683; 361/753; 361/759; 361/801; 361/807; 248/65
(58) Field of Search .................................. 361/726, 732, 361/735, 736, 737, 740, 741, 742, 747, 748, 752, 753, 758, 759, 789, 790, 791, 799, 796, 801–804, 770, 772, 774, 818, 825, 807, 809; 439/64, 76.1, 325, 327, 946; 174/34 R, 35 GC; 248/65, 71, 73

(56) References Cited

U.S. PATENT DOCUMENTS

| | | |
|---|---|---|
| 3,066,367 A | 12/1962 | Garman |
| 3,777,052 A | 12/1973 | Fegen |
| 3,996,500 A | 12/1976 | Coules |
| 4,389,759 A | 6/1983 | Yuda |
| 4,495,380 A | 1/1985 | Ryan et al. |
| 4,627,760 A | 12/1986 | Yagi et al. |
| 4,674,910 A | 6/1987 | Hayashi |
| 4,701,984 A | 10/1987 | Wyckoff |
| 4,855,873 A | 8/1989 | Bhargava et al. |
| 4,901,205 A | 2/1990 | Landis et al. |
| 4,938,703 A | 7/1990 | Nakano |
| 5,085,589 A | 2/1992 | Kan |
| 5,138,529 A | 8/1992 | Colton et al. |
| 5,164,916 A | 11/1992 | Wu et al. |
| 5,191,513 A | 3/1993 | Sugiura et al. |
| 5,218,760 A | 6/1993 | Colton et al. |
| 5,225,629 A | 7/1993 | Garrett |
| 5,241,451 A | 8/1993 | Walburn et al. |
| 5,267,125 A | 11/1993 | Liu |
| 5,452,184 A | 9/1995 | Scholder et al. |
| 5,467,254 A | 11/1995 | Brusati et al. |
| 5,490,038 A | 2/1996 | Scholder et al. |
| 5,513,996 A | 5/1996 | Annerino et al. |
| 5,519,169 A | 5/1996 | Garrett et al. |

(List continued on next page.)

OTHER PUBLICATIONS

U.S. application No. 08/988,946, Boe, filed Apr. 24, 2000.
U.S. application No. 09/231,306, Klein et al., filed Jan. 13, 1999.
U.S. application No. 09/231,307, Johnson, filed Jan. 13, 1999.
U.S. application No. 09/472,725, Leman et al., filed Dec. 27, 1999.

*Primary Examiner*—Jayprakash N. Gandhi
(74) *Attorney, Agent, or Firm*—Perkins Coie LLP

(57) ABSTRACT

Methods and apparatuses for removably securing circuit boards to computer chassis. In one embodiment, a movable mounting member is mounted to a mounting bracket that moves relative to the chassis. The mounting member is engaged with a portion of the circuit board, such as an aperture or edge of the circuit board. The mounting bracket and movable mounting member are biased with a biasing device to secure the circuit board relative to the chassis. In one aspect of this embodiment, the circuit board can be placed in tension or alternatively, the circuit board can be placed in compression. In another aspect of this embodiment, the biasing device is operable only from within the chassis to bias the mounting bracket. In another embodiment, the mounting bracket can be eliminated and the circuit board can be biased directly against at least one fixed mounting member attached to the chassis.

32 Claims, 7 Drawing Sheets

U.S. PATENT DOCUMENTS

| | | |
|---|---|---|
| 5,537,294 A | 7/1996 | Siswinski |
| 5,563,450 A | 10/1996 | Bader et al. |
| 5,647,748 A | 7/1997 | Mills et al. |
| 5,689,863 A | 11/1997 | Sinozaki |
| 5,691,504 A | 11/1997 | Sands et al. |
| 5,706,173 A * | 1/1998 | Carney et al. ............... 361/740 |
| 5,707,244 A | 1/1998 | Austin |
| 5,754,412 A | 5/1998 | Clavin |
| 5,758,987 A | 6/1998 | Frame et al. |
| 5,796,593 A | 8/1998 | Mills et al. |
| 5,833,480 A | 11/1998 | Austin |
| 5,865,518 A | 2/1999 | Jarrett et al. |
| 5,951,307 A | 9/1999 | Klein et al. |
| 5,953,217 A | 9/1999 | Klein et al. |
| 5,973,926 A * | 10/1999 | Sacherman et al. ......... 361/759 |
| 6,017,246 A | 1/2000 | Hisazumi et al. |
| 6,046,912 A | 4/2000 | Leman |
| 6,124,552 A | 6/2000 | Boe |
| 6,114,626 A * | 9/2000 | Barnes et al. ............... 174/52.1 | ns
METHOD AND APPARATUS FOR BIASING A CIRCUIT BOARD INTO ENGAGEMENT WITH A COMPUTER CHASSIS

TECHNICAL FIELD

This invention relates to methods and apparatuses for fastening circuit boards to computer chassis, for example by biasing the circuit boards against mounting members of the chassis.

BACKGROUND OF THE INVENTION

Computers typically include a chassis that houses semiconductor devices, such as memory chips, processors, and linking circuitry mounted to a printed circuit board. The printed circuit board is typically attached with threaded fasteners to standoffs, which are then attached to a surface of the chassis. Accordingly, the stand-offs secure the circuit board to the chassis while leaving a gap between the surface of the circuit board and the surface of the chassis. The gap is typically sized to prevent the devices and connecting circuitry mounted on the circuit board from contacting the chassis, which could cause the devices to short circuit.

One problem with the above design is that it can be time consuming to first threadably attach the stand-offs to each circuit board and then threadably attach each stand-off to the chassis. One approach to address this problem is to attach the circuit board to a plurality of rails with threaded fasteners and then slideably attach the rails to the chassis. One such arrangement is an NLX circuit board available from Intel Corp. of Santa Clara, Calif. The foregoing approach, however, can also have certain drawbacks. For example, it may be difficult and/or intimidating for end users of the computer to remove the circuit board for service or replacement because tools may be required to fasten and unfasten the connection between the circuit board and the rails. Alternatively, if the rails remain attached to the circuit board during servicing, then the rails are not available to fasten a substitute circuit board to the chassis, and the computer may be inoperable during this period.

Another conventional arrangement includes unthreaded stand-offs connected between the chassis and the circuit board and a bracket that engages the circuit board and fastens to a wall of the chassis with an external screw. Such an apparatus is available from Palo Alto Design Group of Palo Alto, Calif. One drawback with this arrangement is that users can deliberately or accidentally loosen the external screw without realizing that they may also loosen the circuit board within the chassis. Another disadvantage is that the external screw must generally be loosened with a tool, which can be intimidating to the end user. Still another disadvantage is that, in addition to loosening the external screw, each unthreaded stand-off must be individually disengaged from the circuit board before the circuit board can be removed from the chassis.

SUMMARY OF THE INVENTION

The present invention is directed toward methods and apparatuses for removably securing circuit boards to computer chassis. The apparatus can include a moveable mounting member with an engaging surface positioned to engage a portion of the circuit board. In one embodiment, the moveable mounting member is attached to a mounting bracket that is movable relative to the chassis. A biasing device is coupled between the mounting bracket and the computer chassis and is adjustable between a first position and a second position. When the biasing device is in the second position, the moveable mounting member is biased against the portion of the circuit board.

In one particular aspect of the invention, the biasing device is operable only from within the chassis. In another aspect of the invention, the moveable mounting member can be the second of at least two mounting members, and can engage a second portion of the circuit board. The apparatus can further include a first mounting member projecting away from a surface of the chassis and having a first engaging surface positioned to engage a first portion of the circuit board. In yet another aspect of the invention, the moveable mounting member is securely engaged with the circuit board when the biasing device is in the second position and is loosely engaged with or disengaged from the circuit board when the biasing device is in the first position. In still another aspect of the invention, the biasing device can include a threaded shaft that engages a threaded shaft aperture of the mounting bracket and has a knob for manually rotating the shaft relative to the shaft aperture to move the shaft between the first position and the second position.

The present invention is also directed toward a method for removably coupling a circuit board to a computer chassis. The method can include engaging a portion of the circuit board with a moveable mounting member connected to a bracket. The moveable mounting member is biased into engagement with the circuit board by operating a biasing device from within the chassis. The method can further include placing a region of the circuit board in tension or compression. In one aspect of the invention, the moveable mounting member is the second of at least two mounting members and engages a second portion of the circuit board. The method can further include engaging a first portion of the circuit board with a first mounting member connected to the computer chassis.

In a method in accordance with another aspect of the invention, at least one mounting member is connected to the chassis and the circuit board is biased toward or away from a surface of the chassis. In still another aspect of the invention, the mounting member can be the first of at least two mounting members connected to the chassis with a first portion of the circuit board biased against the first mounting member and a second portion of the circuit board biased against the second mounting member, placing at least one of the first and second portions of the circuit board in tension or compression in a plane of the circuit board.

DETAILED DESCRIPTION

The present disclosure describes methods and apparatuses for mounting circuit boards to computer chassis. Many specific details of certain embodiments of the invention are set forth in the following description and in FIGS. 1–7 to provide a thorough understanding of these embodiments. One skilled in the art, however, will understand that the present invention may have additional embodiments, and that the invention may be practiced without several of the details described in the following description.

Figure 1:
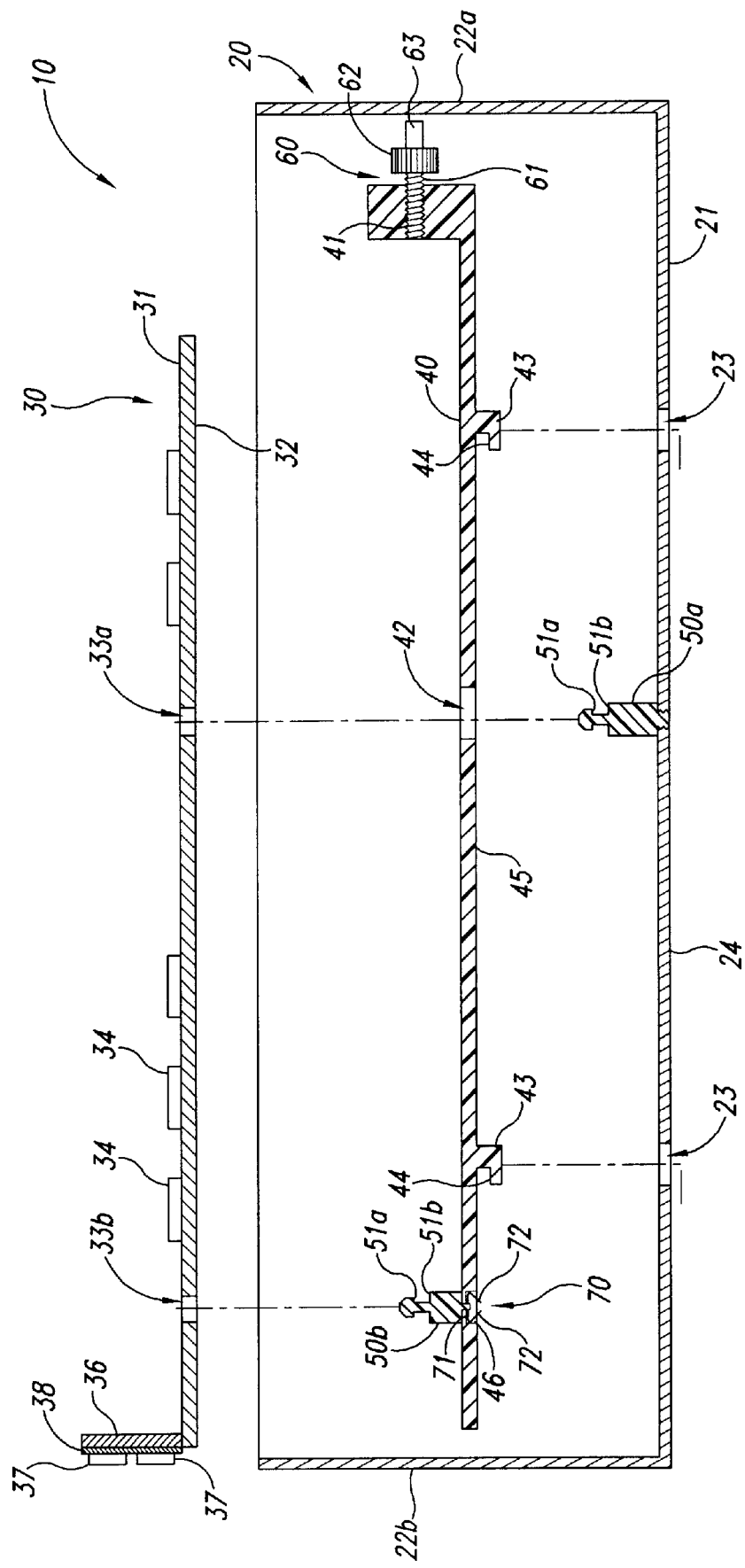
FIG. 1 is an exploded cross-sectional side elevational view of a computer assembly having a chassis, an attachment bracket and a circuit board in accordance with an embodiment of the invention.

FIG. 1 is a cross-sectional side elevational view of a computer assembly 10 having a circuit board 30 removably mounted to a chassis 20 by a mounting bracket 40 in accordance with an embodiment of the invention. A fixed mounting member 50a can be attached to the chassis 20 and a movable mounting member 50b can be attached to the mounting bracket 40 to engage the circuit board 30 (mounting members 50a and 50b are collectively identified herein as "mounting members 50"). The mounting bracket 40 is then biased relative to a wall of the chassis 20 to positively engage the circuit board 30 with the mounting members 50, as described in greater detail below.

The circuit board 30 has an upwardly facing upper surface 31, a downwardly facing lower surface 32, and a plurality of circuit devices 34 mounted to the upper surface 31. The circuit board 30 can further include interconnecting circuitry and additional circuit devices (not shown) on the upper surface 31, the lower surface 32, and/or embedded in the circuit board 30 between the upper and lower surfaces. The interconnecting circuitry extends from the circuit devices 34 to one or more connectors 37 for coupling the circuit board 30 to other circuit boards or devices (not shown). In one embodiment, the connectors 37 can be mounted to a mounting panel 36 that extends upwardly from the upper surface 31 of the circuit board 30. The mounting panel 36 can include a compressible conductive gasket 38 to electrically couple the circuit board 30 to the chassis 20, as will be discussed in greater detail below with reference to FIG. 3. Alternatively, the mounting panel 36 can be eliminated and the connectors 37 can be mounted directly to the circuit board 30. In either of these embodiments, the circuit board 30 can include a first aperture 33a and a second aperture 33b (collectively identified herein as "apertures 33") that extend through the circuit board 30 from the upper surface 31 to the lower surface 32. The apertures 33 are positioned to receive the mounting members 50 for coupling the circuit board 30 to the chassis 20.

In one embodiment, the chassis 20 includes a lower surface 21, a first sidewall 22a, a second sidewall 22b (both extending upwardly from the lower surface 21), and a cover (not shown). The fixed mounting member 50a is fixedly attached to the lower surface 21 of the chassis 20 and is aligned with the first aperture 33a of the circuit board 30. In one aspect of this embodiment, the fixed mounting member 50a includes a threaded end threadably received in a corresponding threaded aperture in the lower surface 21 of the chassis 20. Alternatively, the fixed mounting member 50a can be attached to the lower surface 21 with other threaded or unthreaded fastening arrangements. Mounting slots 23 (two of which are shown in FIG. 1) in the lower surface 21 of the chassis 20 are positioned to engage portions of the mounting bracket 40.

The mounting bracket 40 includes clip portions 43 that are configured to be aligned with a corresponding one of the mounting slots 23 in the lower surface 21 of the chassis 20. Each clip portion 43 has an upwardly facing surface 44 that engages an underside 24 of the chassis lower surface 21 when the mounting bracket 40 is engaged with the chassis 20. The mounting bracket 40 further includes a receiving aperture 42 aligned with the fixed mounting member 50a and sized to allow lateral motion of the mounting bracket 40 relative to the chassis 20 when the fixed mounting member 50a projects through the receiving aperture 42.

The movable mounting member 50b is attached to the mounting bracket 40 to move with the mounting bracket 40. The moveable mounting member 50b is aligned with the second aperture 33b of the circuit board 30. Both the moveable mounting member 50b and the fixed mounting member 50a have a transverse groove defining an upper engaging surface 51a and a lower engaging surface 51b. The upper and lower engaging surfaces 51a and 51b engage the circuit board 30 (best shown and described with reference to FIGS. 2 and 3).

In one embodiment, the mounting bracket 40 further includes a conductive fastener 70 under the movable mounting member 50b that faces downwardly toward the lower surface 21 of the chassis 20. The fastener 70 is in electrical contact with the movable mounting member 50b, which can also be electrically conductive. In one aspect of this embodiment, the fastener 70 is positioned in a fastener aperture 46 in a lower surface 45 of the mounting bracket 40. The fastener 70 can include a lateral portion 71 and two or more downwardly extending flexible flaps 72 attached to opposing ends of the lateral portion 71. The lateral portion 71 can have an aperture that receives a lower portion of the moveable mounting member 50b. Alternatively, the fastener 70 can be biased securely against an upper wall of aperture 46 or the lower portion of the mounting member 50, for example, with a threaded nut (not shown). In either of these embodiments, the flexible flaps 72 project slightly beneath the lower surface 45 of the mounting bracket 40 when the mounting bracket 40 is spaced apart from the chassis lower surface 21. When the mounting bracket 40 is moved toward the chassis lower surface 21, the flexible flaps 72 contact the chassis lower surface 21 so that the fastener 70 and the movable mounting member 50b provide a conductive link between the circuit board 30 and the chassis 21.

The mounting bracket 40 can still further include a biasing device 60 configured to move the mounting bracket 40 and the movable mounting member 50b as a unit relative to the chassis 20. In one aspect of this embodiment, the biasing device 60 includes a threaded shaft 61 threadably received in a corresponding threaded shaft aperture 41 of the mounting bracket 40. The shaft 61 can include a shaft end 63 facing toward the first sidewall 22a and a knob 62 for manually rotating the shaft 61 into and out of the shaft aperture 41. The shaft 61 and/or the knob 62 can also include a locking mechanism (not shown) to secure the shaft 61 in a selected position.

Figure 2:
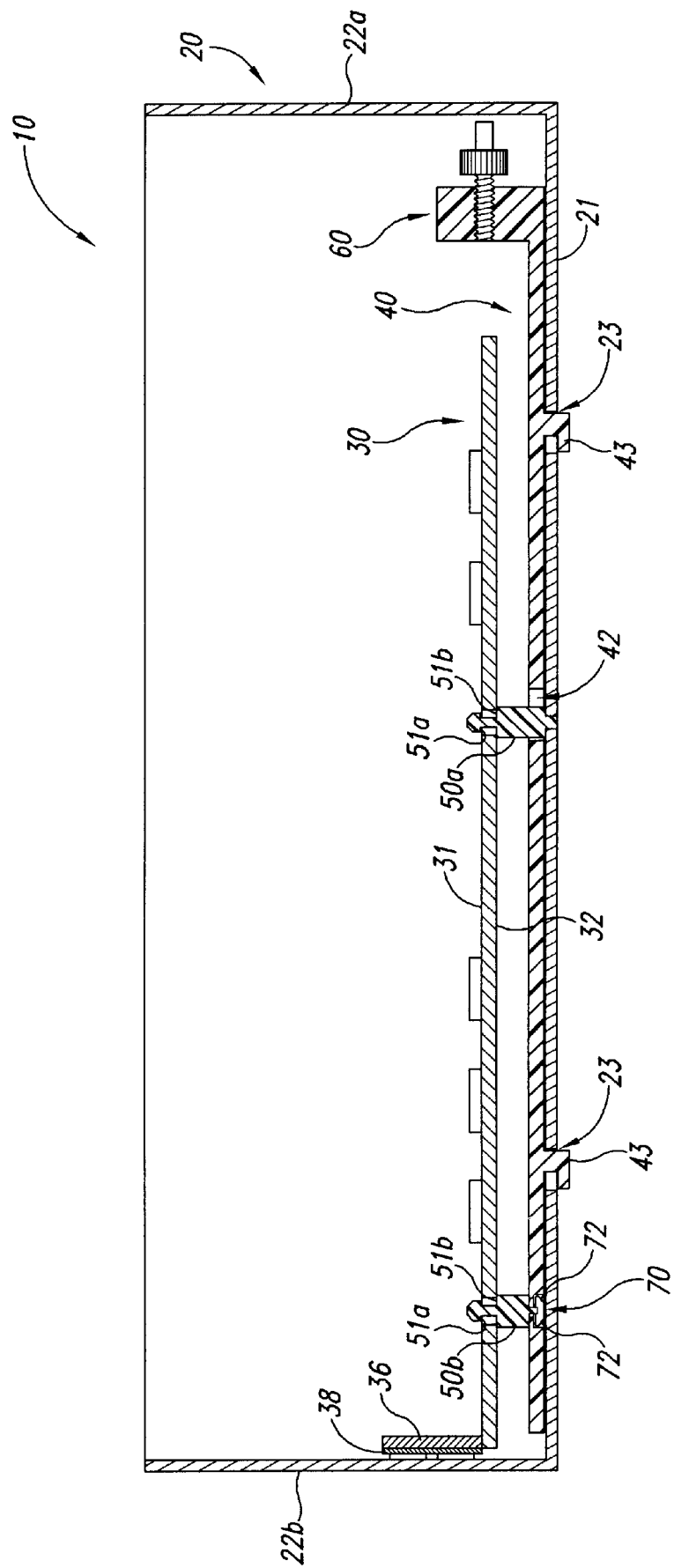
FIG. 2 is a cross-sectional side elevational view of the computer assembly shown in FIG. 1 with the attachment bracket and circuit board in position for fastening to the chassis.
Figure 3:
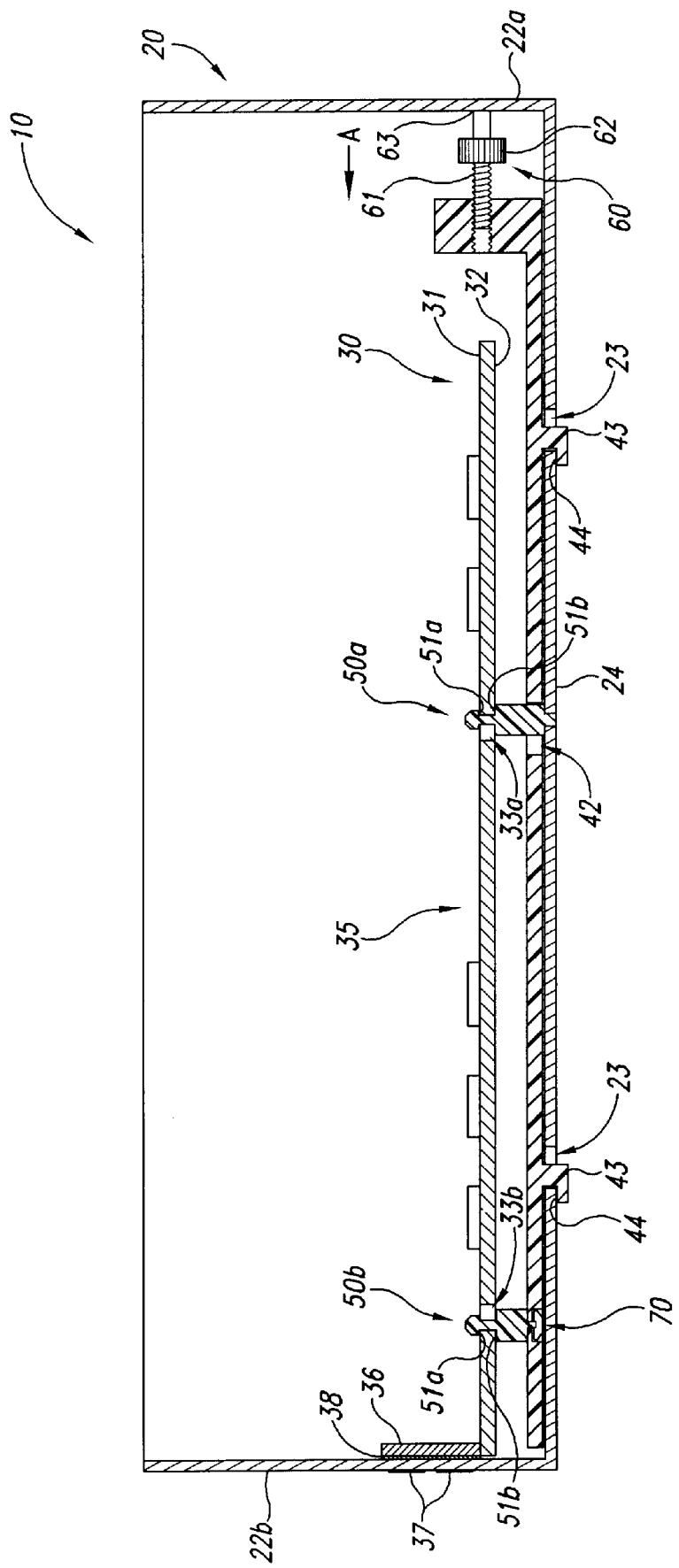
FIG. 3 is a cross-sectional side elevational view of the computer assembly shown in FIGS. 1 and 2 with the circuit board and attachment assembly secured to the chassis.

The operation of an embodiment of the apparatus 10 is best understood with reference to FIGS. 2 and 3. As shown in FIG. 2, the mounting bracket 40 is aligned with the chassis 20 and lowered until the clip portions 43 extend through the mounting slots 23 in the lower surface 21 of the chassis 20. The fixed mounting member 50a projects upwardly through the receiving aperture 42 of the mounting bracket 40 with the upper engaging surface 51a and the lower engaging surface 51b of the fixed mounting member 50a positioned above the mounting bracket 40.

As the mounting bracket 40 contacts the lower surface 21, the upper and lower engaging surfaces 51a and 51b of the movable mounting member 50b align with the corresponding upper and lower engaging surfaces 51a and 51b of the fixed mounting member 50a. The flexible flaps 72 of the fastener 70 contact the lower surface 21 and resiliently collapse slightly toward each other to bias against the chassis lower surface 21. Accordingly, the flexible flaps 72 form a positive electrical contact with the chassis lower surface 21. The circuit board 30 is then lowered toward the mounting bracket 40 until the upper surface 31 of the circuit board 30 is aligned with the downwardly facing upper engaging surfaces 51a of the mounting members 50 and the lower surface 32 is aligned with the upwardly facing lower engaging surfaces 51b of the mounting members 50.

As shown in FIG. 3, the circuit board 30 is secured to the mounting members 50 by adjusting the biasing device 60. When the biasing device 60 includes the threaded shaft 61 and the knob 62 discussed above with reference to FIG. 1, an operator can rotate the knob 62 until the shaft end 63 engages the first sidewall 22a of the chassis 20. As the operator continues to rotate the knob 62, the biasing device 60 drives the mounting bracket 40 away from the first sidewall 22a (arrow "A"). As the mounting bracket 40 moves away from the first sidewall 22a under the force of the biasing device 60, the movable mounting member 50b moves with the mounting bracket 40 to one side or wall of the second aperture 33b in the circuit board 30. The circuit board 30 then moves with the mounting bracket 40 until an opposing side or wall of the first aperture 33a engages the fixed mounting member 50a. The operator can then further tighten the threaded shaft 61 against the first sidewall 22a of the chassis 20 to firmly engage each mounting member 50 with the walls of the corresponding aperture 33. Accordingly, an intermediate portion 35 of the circuit board 30 between the apertures 33 is tensioned between the mounting members 50 (in the plane defined by the circuit board 30) to resist lateral motion of the circuit board 30 relative to the chassis 20. The upper engaging surfaces 51a of the mounting members 50 extend over the upper surface 31 of the circuit board 30 and the lower engaging surfaces 51b of the mounting members 50 extend below the lower surface 32 of the circuit board 30 to restrict vertical motion of the circuit board 30 relative to the chassis 20.

Additionally, as the biasing device 60 drives the mounting bracket 40 moves away from the first chassis wall 22a, the clip portions 43 move with the mounting bracket 40 until the upwardly facing surfaces 44 of each clip portion 43 face toward the underside 24 of the chassis lower surface 21 to resist upward movement of the mounting bracket 40 relative to the chassis 20. The clip portions 43 can also engage the walls of the mounting slots 23 so that the clip portions 43 resist lateral movement of the mounting bracket 40 relative to the chassis 22. To remove the circuit board 30 from the chassis 20, the foregoing steps are reversed.

In one aspect of this embodiment, the threads on the threaded shaft 61 can be coarse enough to tighten the mounting bracket 40 against the chassis 20 by rotating the knob 62 by 180 degrees or less. In other embodiments, the threads can be finer to provide more precise control over the tension applied to the circuit board 30. In another aspect of this embodiment the mounting members 50 engage a conductive portion (such as a ground plane) of the circuit board 30 as they press against the walls of the apertures 33. Accordingly, the mounting members 50 and the conductive fasteners 70 provide a conductive link between the circuit board 30 and the chassis lower surface 21.

In one embodiment, the computer assembly 10 can include the conductive gasket 38 between the mounting panel 36 and the second sidewall 22b of the chassis 20, either in addition to or in lieu of the conductive mounting members 50 and the conductive fasteners 70. As the mounting bracket 40 and the circuit board 30 move away from the first sidewall 22a, the mounting panel 36 presses the conductive gasket 38 securely against the second sidewall 22b. Accordingly, the conductive gasket 38 can provide a conductive path (for example, a ground path) between the circuit board 30 and the chassis 20. In one aspect of this embodiment, the conductive gasket 38 can include a conductive fabric that surrounds a layer of compressible foam which compresses as the mounting panel 36 moves toward the second sidewall 22b. Alternatively, the conductive gasket 38 can have other configurations that conductively couple the mounting panel 36 to the chassis 20. In either embodiment, the conductive gasket 38 can provide the sole electrical contact between the chassis 20 and the circuit board 30, eliminating the need for the conductive fastener 70 discussed above. The mounting members 50 can be made from a dielectric material (such as a plastic) instead of a conductive material.

One feature of an embodiment of the computer assembly 10 discussed above with reference to FIGS. 1–3 is that the circuit board 30 can be installed and removed without the use of tools. An advantage of this feature, when compared to some conventional arrangements, is that it is easier for end users to remove the circuit board 30 from both the chassis 20 and the mounting bracket 40. Another feature of the computer assembly 10 is that it can save assembly and disassembly steps. For example, the single operation of loosening the biasing device 60 both disengages the mounting bracket 40 from the chassis 20 and also disengages the circuit board 30 from the mounting bracket 40 (or leaves the 30 circuit boards only loosely engaged with the mounting bracket 40 for easy removal from the mounting bracket 40).

A further advantage is that the circuit board 30 can be easily separated from the mounting bracket 40 for shipping the circuit board 30 to a service center or other location. Accordingly, the mounting bracket 40 can support a replacement circuit board while the original circuit board 30 is being serviced. In addition, the mounting bracket 40 need not be shipped with the circuit board 30, which reduces the cost of shipping the circuit board 30.

Still a further advantage is that the mounting bracket 40 is reusable after the circuit board 30 has been removed. Accordingly, end users can install a replacement circuit board 30 without having to replace the mounting bracket 40 as well. This is unlike some conventional arrangements in which the circuit board and the mounting bracket must be removed as a unit, or removing the circuit board from the mounting bracket renders the mounting bracket unusable for other circuit boards.

Yet another advantage is that the biasing device 60 is inaccessible from the outside of the chassis 20. Accordingly, the biasing device 60 is less likely to be inadvertently moved from its secured position. As a result, the circuit board 30 is less likely to be inadvertently separated from the chassis 20.

In an alternate arrangement to that discussed above with reference to FIGS. 1–3, the fixed mounting member 50a can be eliminated and the moveable mounting member 50b can bias the circuit board 30 toward the second sidewall 22b of the chassis 20. An advantage of this alternate arrangement is that it may be simpler to construct and use.

Figure 4:
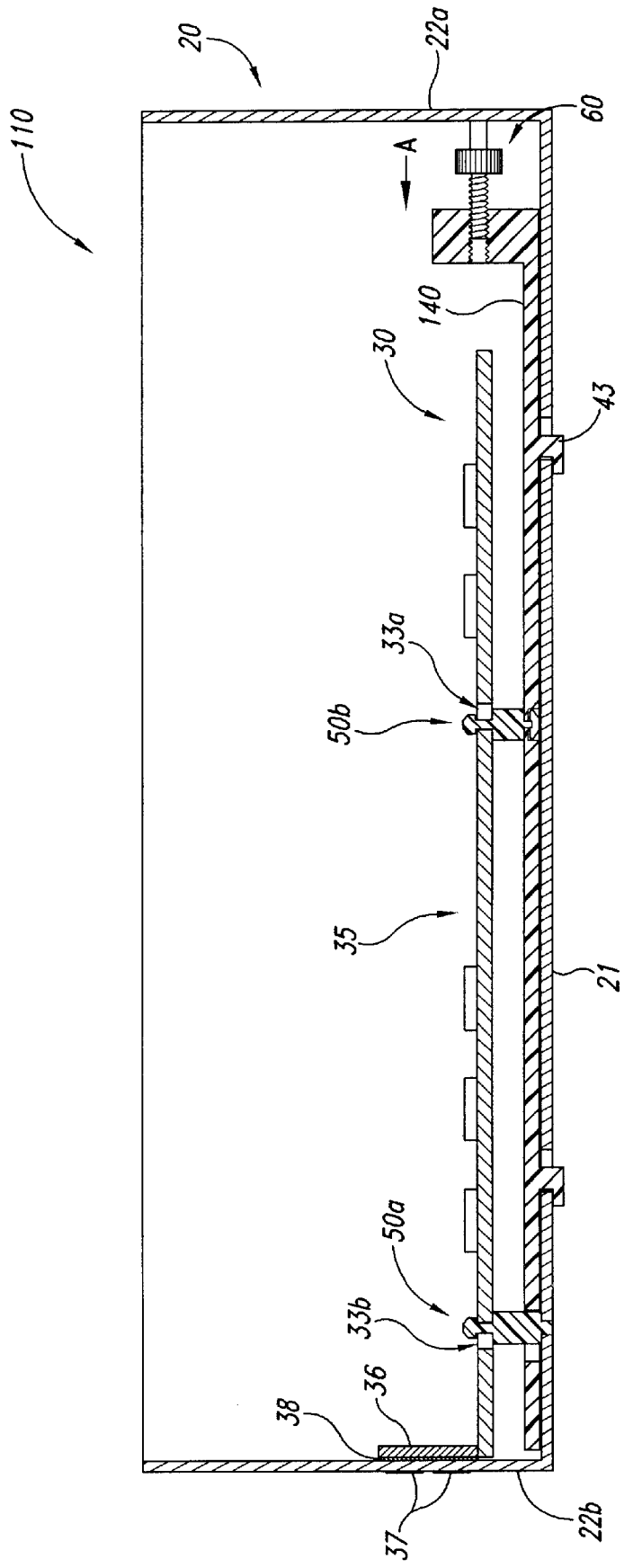
FIG. 4 is a cross-sectional side elevational view of a computer assembly having a circuit board secured to a chassis with a bracket in accordance with another embodiment of the invention.

FIG. 4 is a cross-sectional side elevational view of a computer assembly 110 having a mounting bracket 140 that compresses the circuit board 30 in accordance with another embodiment of the invention. The mounting bracket 140 includes a movable mounting member 50b aligned with the first aperture 33a of the circuit board 30 and a fixed mounting member 50a aligned with the second aperture 33b of the circuit board 30. Accordingly, when the biasing device 60 moves the mounting bracket 140 from right to left as indicated by arrow A, the movable mounting member 50b engages the walls of the first aperture 33a and compresses the intermediate portion 35 of the circuit board 30 against the fixed mounting member 50a.

In an alternate arrangement, the fixed mounting member 50a can be replaced with another movable mounting member 50b (not shown) attached to the mounting bracket 140 and aligned with the second aperture 33b. Accordingly, all the mounting members 50 of this embodiment move with the mounting bracket 140 (arrow A) from right to left during installation. The mounting members 50 engage the circuit board 30 and bias the circuit board 30 in the direction indicated by arrow A to clamp the conductive gasket 38 between the mounting panel 36 of the circuit board 30 and the second sidewall 22b of the chassis 20. Accordingly, this alternate arrangement also compresses the intermediate portion 35 of the circuit board 30.

An advantage of compressing the intermediate portion 35 of the circuit board 30 is that this arrangement may be suitable when the circuit board 30 and/or devices on the circuit board 30 are particularly sensitive to tensile forces, such as those produced by the mounting bracket 40 discussed above with reference to FIGS. 1–3.

Conversely, an advantage of the mounting bracket 40 shown in FIGS. 1–3 is that it may be suitable when the circuit board 30 is less sensitive to tensile stresses than compressive stresses.

Figure 5:
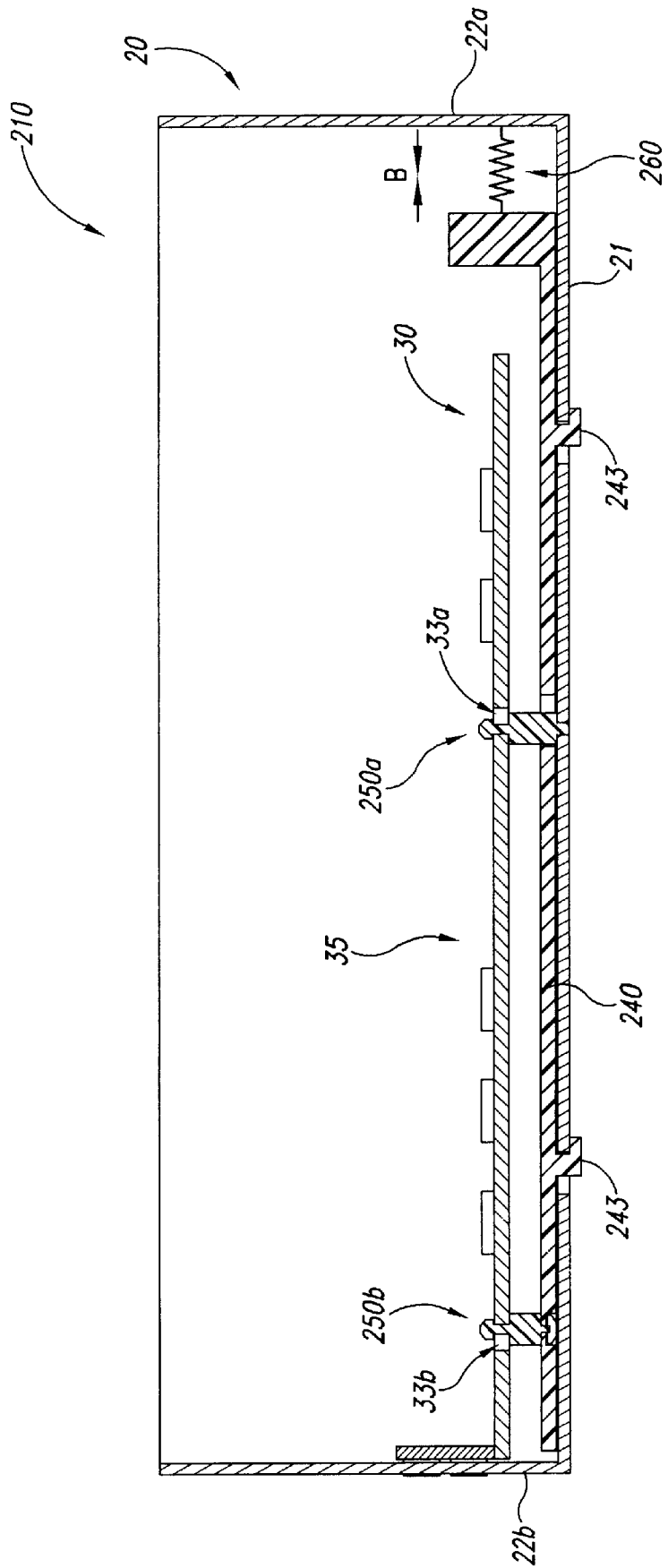
FIG. 5 is a cross-sectional side elevational view of a computer assembly having an attachment bracket that compresses a circuit board in accordance with another embodiment of the invention.

FIG. 5 is a cross-sectional side elevational view of a computer assembly 210 having an attachment bracket 240 that is biased toward the first sidewall 22a of the chassis 20 with a biasing device 260, such as a spring. In one aspect of this embodiment, the computer assembly 210 can include the circuit board 30 having its first aperture 33a aligned with a fixed mounting member 250a attached to the lower surface 21 of the chassis 20. The second aperture 33b is aligned with a movable mounting member 250b attached to the mounting bracket 240.

In operation, the mounting bracket 240 is aligned with the chassis 20 and the circuit board 30 is aligned with the mounting bracket 240 in a manner generally similar to that discussed above with reference to FIGS. 1–2. The biasing device 260 is then coupled between the mounting bracket 240 and the first sidewall 22a of the chassis 20 to draw the mounting bracket 240 toward the right sidewall 22a as indicated by arrow "B." The mounting bracket 240 accordingly compresses the intermediate portion 35 of the circuit board 230 between the mounting members 250. The mounting bracket 240 can also include clip portions 243 that engage the lower surface 21 of the chassis 20 in a manner generally similar to that discussed above with reference to FIGS. 1–3.

In an alternative embodiment, the biasing device 260 can include another arrangement for drawing the mounting bracket 240 toward the first sidewall 22a of the chassis 20. For example, the biasing device 260 can include a threaded shaft 61 and a knob 62 similar to those shown in FIGS. 1–3, with a shaft end 63 of the shaft 61 rotatably coupled to the first sidewall 22a of the chassis 20 by a ball joint or other suitable rotational joints known in the art. Accordingly, the knob 62 can be rotated to draw the mounting bracket 240 toward the first sidewall 22a.

Figure 6:
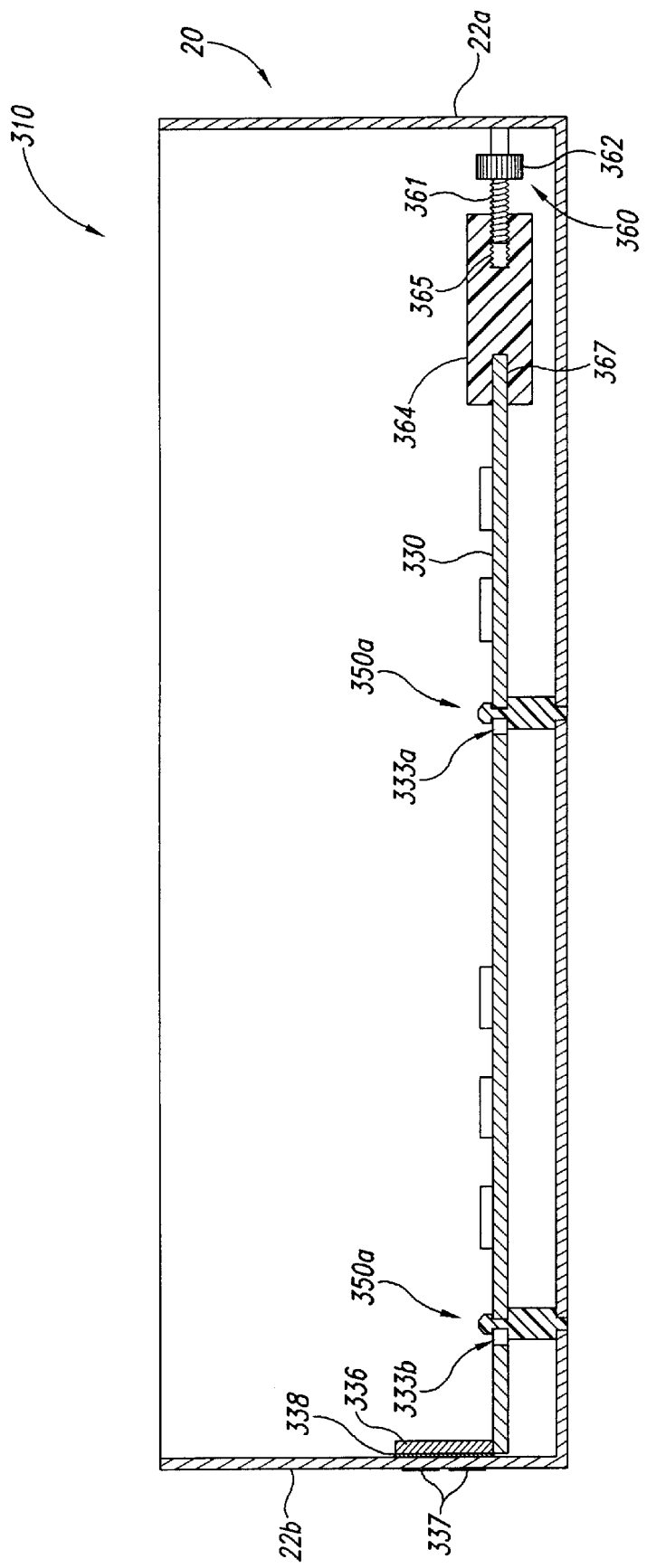
FIG. 6 is a cross-sectional side elevational view of a computer assembly having a circuit board that is biased relative to a chassis without an attachment bracket.

FIG. 6 is a cross-sectional side elevational view of a computer assembly 310 having a circuit board 330 biased into engagement with two fixed mounting members 350a without a mounting attachment bracket. In one aspect of this embodiment, the computer assembly 310 can include a biasing device 360 having a threaded shaft 361 and a knob 362. The threaded shaft 361 is received in a threaded aperture 365 of a shaft receiving portion 364 of the circuit board 330. In one aspect of the embodiment, the shaft receiving portion 364 is formed integrally with the circuit board 330. Alternatively, the shaft receiving portion 364 can be removably coupled to the circuit board 330, for example, by inserting an edge of the circuit board 330 into a slot 367 of the shaft receiving portion 364. The circuit board 330 includes first and second apertures 333a and 333b each aligned with one of the mounting members 350a and biased into engagement with the mounting members 350a by rotating the knob 362 in a manner generally similar to that discussed above with reference to FIG. 3. Alternatively, the circuit board 330 can be biased using other devices, such as the spring shown in FIG. 5. The circuit board 330 can also include a mounting panel 336 with connectors 337 and a compressible gasket 338 in an arrangement generally similar to that discussed above with reference to FIG. 3. In another alternative arrangement, the computer assembly 360 can include a single mounting member 350a in place of the two mounting members 350a shown in FIG. 6.

Figure 7:
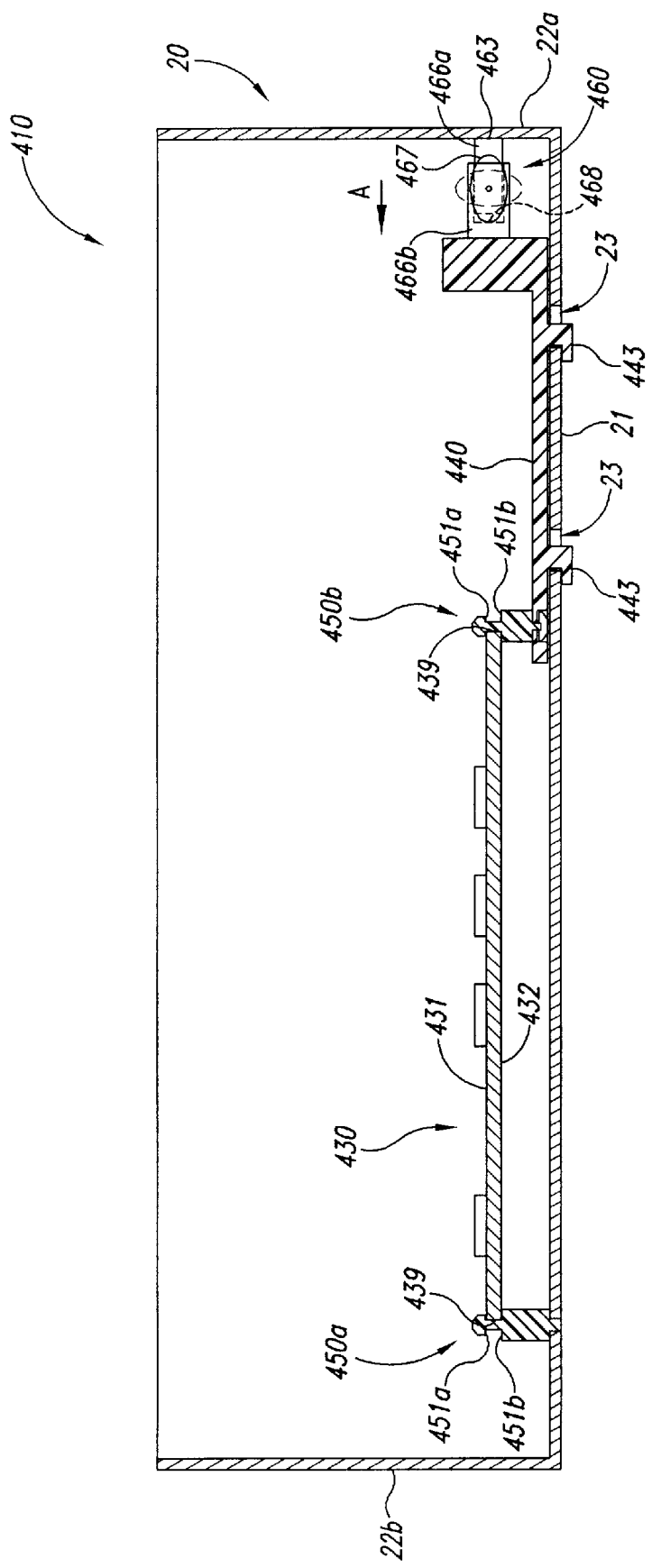
FIG. 7 is a cross-sectional side elevational view of a computer assembly having a circuit board attached to a chassis with a bracket in accordance with yet another embodiment of the invention.

FIG. 7 is a cross-sectional side elevational view of a computer assembly 410 having mounting members 450 (shown as a fixed mounting member 450a and a moveable mounting member 450b) that clamp the edges 439 of a circuit board 430. In one aspect of this embodiment, the fixed mounting member 450a is fixedly mounted to the lower surface 21 of the chassis 20, and the movable mounting member 450b is attached to a mounting bracket 440 that can move relative to the chassis 20. Each of the mounting members 450 includes an upper engaging surface 451a that engages an upper surface 431 of the circuit board 430, and a lower engaging surface 451b that engages a lower surface 432 of the circuit board 430. The mounting bracket 440 includes clip portions 443 that extend through mounting slots 23 in the lower surface 21 of the chassis 20. The mounting bracket 440 is biased away from the first sidewall 22a of the chassis 20 (arrow A) to compress the entire circuit board 430 between the two mounting members 450.

In one embodiment, the mounting bracket 440 is biased with a biasing device 460 that includes a first shaft portion 466a slideably received in an aperture of a second shaft portion 466b. The right end 463 of the first shaft portion 466a bears against the first sidewall 22a. An eccentric cam 467 is pivotally mounted to the first shaft portion 466a and bears against an endwall 468 of the second shaft portion 466b. When the cam 467 is rotated 90 degrees (either clockwise or counterclockwise) from the orientation shown in phantom lines in FIG. 7 to the orientation shown in solid lines, the second shaft portion 466b is forced away from the first sidewall 22a of the chassis 20, biasing the mounting bracket 440 away from the first sidewall 22a as indicated by arrow A.

One feature of an embodiment of the computer assembly 410 shown in FIG. 7 is that the mounting members 450 engage the edges 439 of the circuit board 430. Accordingly, the arrangement of the mounting members 450 can be used with any circuit board 430 having the same overall dimensions as that shown in FIG. 7 independent of the location of any apertures in that circuit board. Another feature of the computer assembly 410 is that the biasing force exerted by the cam 467 on the circuit board 430 via the mounting bracket 440 is limited by the eccentricity of the cam 467. Accordingly, the cam arrangement can prevent the circuit board 430 from being overcompressed to avoid damaging the circuit board 430.

From the foregoing, it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An assembly for releasably mounting a computer circuit board to a computer chassis, comprising:
    a mounting bracket movable relative to the chassis, the mounting bracket having a moveable mounting member with an engaging surface positioned to engage a portion of the circuit board, the moveable mounting member moving with the mounting bracket relative to the chassis; and
    a biasing device coupled between the mounting bracket and the computer chassis and operable only from within the chassis, the biasing device being adjustable between a first position and a second position with the moveable mounting member biased against the portion of the circuit board when the biasing device is in the second position.

2. The assembly of claim 1 wherein the moveable mounting member is the second of at least two mounting members and the engaging surface of the second mounting member is a second engaging surface biased against a second portion of the circuit board, further comprising a first mounting member projecting away from a surface of the chassis and having a first engaging surface positioned to engage a first portion of the circuit board.

3. The assembly of claim 2 wherein the biasing device biases the second mounting member away from the first mounting member when the biasing device is in the second position.

4. The assembly of claim 2 wherein the biasing device places a region of the circuit board between the first and second mounting members in tension when the biasing device is in the second position.

5. The assembly of claim 2, further comprising the chassis, further wherein the first mounting member has external threads and the chassis has an internally threaded aperture in which the external threads of the first mounting member are threadably received.

6. The assembly of claim 1, further comprising a compressible electrically conductive gasket positioned between the circuit board and a surface of the chassis, the gasket being electrically coupled to the circuit board and the chassis.

7. The assembly of claim 6 wherein the moveable mounting member is electrically non-conductive.

8. The assembly of claim 1 wherein the moveable mounting member is coupled to a fastener having electrically conductive flexible portions, the flexible portions being compressed and engaged with the chassis when the bracket is coupled to the chassis.

9. The assembly of claim 1 wherein the mounting bracket has a threaded shaft aperture and the biasing device includes a threaded shaft threadably engaged with the shaft aperture and having a knob configured to receive a user's fingers, the shaft and the knob being rotatable relative to the shaft aperture between the first position and the second position, the shaft being engaged with a wall of the chassis when the biasing device is in the second position.

10. The assembly of claim 1 wherein the moveable mounting member is securely engaged with the circuit board when the biasing device is in the second position and the moveable mounting member is loosely engaged with or disengaged from the circuit board when the biasing device is in the first position.

11. The assembly of claim 1 wherein the portion of the circuit board includes an aperture and the moveable mounting member is at least partially received in the aperture and engages a wall of the aperture.

12. An assembly for releasably mounting a computer circuit board to a computer chassis, comprising;
    a first mounting member projecting away from a first surface of the chassis and having a first engaging surface engaged with a wall of a first aperture of the circuit board;
    a mounting bracket having a receiving opening configured to receive the first mounting member with the first mounting member projecting through the receiving opening, the receiving opening being larger than the first mounting member to allow the mounting bracket to move relative to the first mounting member when the first mounting member is received in the receiving opening;
    a second mounting member attached to the mounting bracket and having a second engaging surface engaged with a wall of a second aperture of the circuit board; and
    a biasing device attached to the mounting bracket and adjustable between a first position with the biasing device spaced apart from a second surface of the chassis and a second position with the biasing device positioned against the second surface of the chassis to bias the first and second mounting members toward or away from each other and bias the first mounting member against the wall of the first aperture of the circuit board and bias the second mounting member against the wall of the second aperture.

13. The assembly of claim 12 wherein the walls of the circuit board apertures are electrically conductive and the first and second mounting members are electrically conductive to provide a conductive link between the circuit board and the chassis.

14. The assembly of claim 12 wherein the first and second mounting members each have a transverse groove with a downward facing surface positioned to engage an upper surface of the circuit board and an upward facing surface positioned to engage a lower surface of the circuit board.

15. The assembly of claim 12, further comprising a compressible electrically conductive gasket positioned between the circuit board and a surface of the chassis, the gasket being electrically coupled to the circuit board and the chassis.

16. The assembly of claim 15 wherein the chassis has a third surface opposite the second surface and the conductive gasket is positioned between the circuit board and the third surface of the chassis.

17. The assembly of claim 15, further comprising the circuit board, wherein the circuit board has a ground plane electrically coupled to the conductive gasket.

18. The assembly of claim 12, wherein the biasing device is positioned within the chassis and is operable only from within the chassis.

19. A computer assembly, comprising:
a circuit board;
a computer chassis;
a first mounting member projecting from a surface of the chassis and having a first engagement surface engaged with a first portion of the circuit board; and
a biasing device coupled between the circuit board and the chassis, the biasing device being operable only from within the chassis between a first position and a second position with the biasing device biasing the first portion of the circuit board into engagement with the first mounting member when the biasing device is in the second position.

20. The assembly of claim 19, further comprising a second mounting member projecting from the surface of the chassis and having a second engagement surface engaged with a second portion of the circuit board, further wherein the biasing device biases the second portion of the circuit board into engagement with the second mounting member when the biasing device is in the second position.

21. The assembly of claim 20 wherein the first portion of the circuit board includes a first aperture and the first mounting member is at least partially received in the first aperture and engages a wall of the first aperture, further wherein the second portion of the circuit board includes a second aperture and the second mounting member is at least partially received in the second aperture and engages a wall of the second aperture.

22. The assembly of claim 20 wherein a region of the circuit board between the first and second mounting members is in tension when the biasing device is in the second position.

23. An assembly for releasably mounting a computer circuit board to a computer chassis, comprising;
a first mounting member fixed to and projecting away from a first surface of the chassis and having a first engaging surface engaged with a wall of a first aperture of the circuit board;
a mounting bracket having a receiving opening configured to receive the first mounting member with the first mounting member projecting through the receiving opening, the receiving opening being larger than the first mounting member to allow the mounting bracket to move relative to the first mounting member when the first mounting member is received in the receiving opening;
a second mounting member attached to the mounting bracket and having a second engaging surface engaged with a wall of a second aperture of the circuit board; and
a biasing device attached to the mounting bracket and adjustable between a first position with the biasing device spaced apart from a second surface of the chassis and a second position with the biasing device positioned against the second surface of the chassis to bias the first and second mounting members toward or away from each other and bias the first mounting member against the wall of the first aperture of the circuit board and bias the second mounting member against the wall of the second aperture.

24. An assembly for releasably mounting a computer circuit board to a computer chassis, comprising;
a first mounting member fixed to and projecting away from a first surface of the chassis and having a first engaging surface engaged with a wall of a first aperture of the circuit board;
a mounting bracket having a receiving opening configured to receive the first mounting member with the first mounting member projecting through the receiving opening, the receiving opening being larger than the first mounting member to allow the mounting bracket to move relative to the first mounting member when the first mounting member is received in the receiving opening;
a clip portion attached to the mounting bracket and configured to be aligned with a corresponding mounting slot in a lower surface of the chassis;
a second mounting member attached to the mounting bracket and having a second engaging surface engaged with a wall of a second aperture of the circuit board; and
a biasing device attached to the mounting bracket and adjustable between a first position with the biasing device spaced apart from a second surface of the chassis and a second position with the biasing device positioned against the second surface of the chassis to bias the first and second mounting members toward or away from each other and bias the first mounting member against the wall of the first aperture of the circuit board and bias the second mounting member against the wall of the second aperture.

25. A method for removably coupling a circuit board to a computer chassis, comprising:
engaging a portion of the circuit board with a moveable mounting member connected to a bracket;
biasing the bracket toward or away from a surface of the chassis by operating a biasing device from within the chassis;
biasing the moveable mounting member into engagement with the circuit board; and
placing a region of the circuit board in tension or compression.

26. The method of claim 25 wherein the moveable mounting member is the second of at least two mounting members and engages the second of at least two portions of the circuit board, further comprising engaging a first portion of the circuit board with a first mounting member connected to the computer chassis.

27. The method of claim 25 wherein engaging the moveable mounting member with the first portion of the circuit board includes receiving the moveable mounting member in an aperture of the circuit board.

28. The method of claim 25 wherein biasing the bracket includes rotating a threaded shaft relative to a threaded aperture of the bracket to draw the bracket toward or away from the surface of the chassis.

29. The method of claim 25, further comprising grounding the circuit board to the chassis by engaging a conductive fastener with the circuit board and the chassis and compressing electrically conductive flexible portions of the fastener against at least one of the chassis and the circuit board.

30. A method for removably coupling a circuit board to a computer chassis, comprising:
engaging a first portion of the circuit board with a first mounting member connected to the computer chassis;

biasing the circuit board toward or away from a surface of the chassis by operating a biasing device from within the chassis;

biasing the first portion of the circuit board against the first mounting member;

placing the first portion of the circuit board in tension or compression in a plane of the circuit board.

31. The method of claim 30, further comprising:

engaging a second portion of the circuit board with a second mounting member connected to the chassis; and biasing the second portion of the circuit board against the second mounting member.

32. The method of claim 30, further comprising grounding the circuit board to the chassis by engaging a conductive fastener with the circuit board and the chassis and compressing electrically conductive flexible portions of the fastener against at least one of the chassis and the circuit board.

* * * * *